United States Patent
Hamlin et al.

(10) Patent No.: US 10,940,802 B2
(45) Date of Patent: Mar. 9, 2021

(54) VEHICLE DISPLAY APPARATUS AND MOUNTING CONFIGURATION

(71) Applicant: Gentex Corporation, Zeeland, MI (US)

(72) Inventors: Bradley R. Hamlin, Allendale, MI (US); Jason D. Hallack, Holland, MI (US)

(73) Assignee: GENTEX CORPORATION, Zeeland, MI (US)

( * ) Notice: Subject to any disclaimer, the term of this patent is extended or adjusted under 35 U.S.C. 154(b) by 0 days.

(21) Appl. No.: 16/512,839

(22) Filed: Jul. 16, 2019

(65) Prior Publication Data
US 2020/0023776 A1 Jan. 23, 2020

Related U.S. Application Data

(60) Provisional application No. 62/700,049, filed on Jul. 18, 2018.

(51) Int. Cl.
*H05K 7/20* (2006.01)
*B60R 1/12* (2006.01)
*B60R 1/08* (2006.01)

(52) U.S. Cl.
CPC ............... *B60R 1/12* (2013.01); *B60R 1/088* (2013.01); *H05K 7/20963* (2013.01); *B60R 2001/1215* (2013.01); *B60R 2300/20* (2013.01)

(58) Field of Classification Search
CPC ......... H05K 7/20954–20963; G02F 1/133385; B60R 1/088; B60R 1/12; B60R 2001/1215; B60R 2300/20
See application file for complete search history.

(56) References Cited

U.S. PATENT DOCUMENTS

| 7,706,046 | B2 | 4/2010 | Bauer et al. |
| 7,855,755 | B2* | 12/2010 | Weller ...................... B60R 1/12 349/11 |
| 8,104,819 | B2* | 1/2012 | Biggs ...................... B60R 11/02 296/72 |
| 8,264,856 | B2* | 9/2012 | Snider .................... H04B 1/082 358/511 |
| 10,018,843 | B2 | 7/2018 | Lee et al. |
| 10,189,408 | B2 | 1/2019 | Hallack et al. |
| 10,215,422 | B2* | 2/2019 | Brockman ............. F16M 13/02 |
| 2006/0278632 | A1* | 12/2006 | Tai ........................... H02G 3/20 220/3.2 |
| 2016/0368379 | A1* | 12/2016 | Larry ................. G02F 1/133385 |
| 2017/0120826 | A1 | 5/2017 | Minikey, Jr. et al. |
| 2017/0166133 | A1 | 6/2017 | Hallack |

* cited by examiner

*Primary Examiner* — Zachary Pape
(74) *Attorney, Agent, or Firm* — Price Heneveld LLP; Bradley D. Johnson

(57) ABSTRACT

A display apparatus for a vehicle comprises a display module comprising a display forming a display surface forming a perimeter. A heat sink is in connection with the display module and disposed behind the display module relative to the display surface. A carrier bracket is disposed in connection with the heat sink. A plurality of display mounting brackets is in connection with the carrier bracket. The display mounting brackets are in connection with the carrier bracket outboard of a center line extending vertically along the carrier bracket.

19 Claims, 4 Drawing Sheets

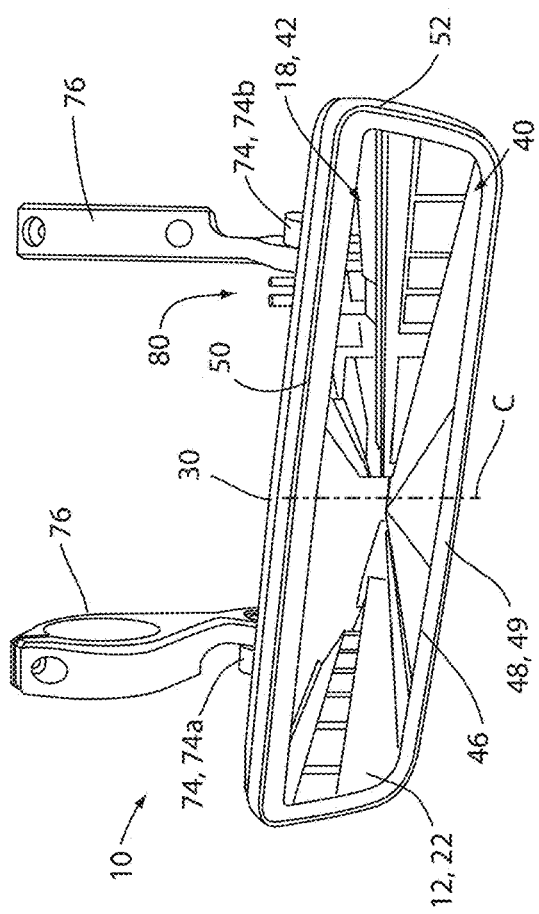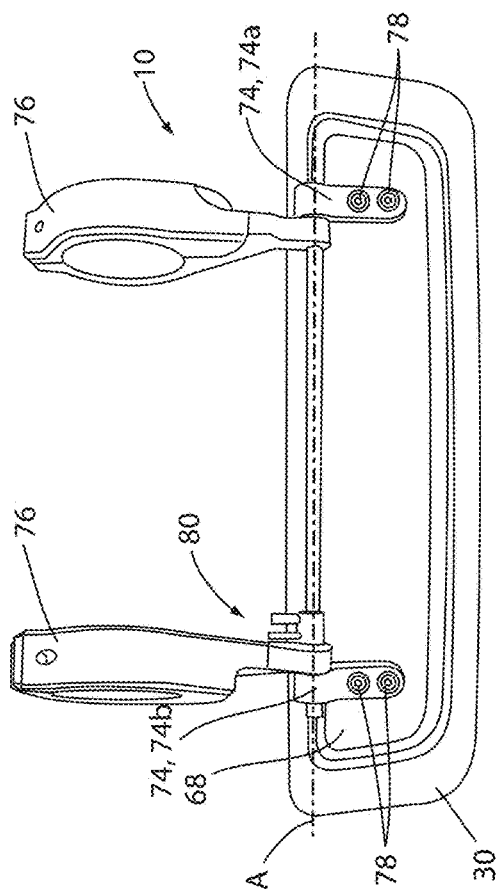

VEHICLE DISPLAY APPARATUS AND MOUNTING CONFIGURATION

CROSS-REFERENCE TO RELATED APPLICATIONS

This application claims priority under 35 U.S.C. § 119(e) and the benefit of U.S. Provisional Application No. 62/700,049 entitled VEHICLE DISPLAY APPARATUS AND MOUNTING CONFIGURATION, filed on Jul. 18, 2018, by Bradley R. Hamlin, et al., the entire disclosure of which is incorporated herein by reference.

TECHNOLOGICAL FIELD

The present disclosure relates generally to a display device for a vehicle and, more particularly, relates to a rearview display device for an automotive vehicle.

SUMMARY

In one aspect of the disclosure, a display apparatus for a vehicle is disclosed. The apparatus comprises a display module comprising a display forming a display surface forming a perimeter. A heat sink is in connection with the display module and disposed behind the display module relative to the display surface. A carrier bracket is disposed in connection with the heat sink. A plurality of display mounting brackets is in connection with the carrier bracket. The display mounting brackets are in connection with the housing outboard of a center line of the carrier bracket.

In another aspect of the disclosure, a display apparatus for a vehicle is disclosed. The apparatus comprises a display module comprising a display forming a display surface. The apparatus further comprises a heat sink in connection with the display module and disposed behind the display module relative to the display surface. A housing encloses the display module and comprises an opening configured to receive a bezel. The bezel extends around a perimeter of the display surface. A carrier bracket disposed inside the housing and in connection with the heat sink. A plurality of mounting brackets are in connection with the carrier bracket through a trim plate of the housing. The mounting brackets are in connection with the housing outboard of a center line extending vertically along the carrier bracket such that the display module is mounted in a plurality of locations along a length of a body of the housing.

In yet another aspect of the disclosure, a display apparatus for a vehicle is disclosed. The display apparatus comprises a display module comprising a display forming a display surface forming a perimeter. A housing encloses the display module. The housing comprises an anterior opening configured to receive a bezel and a posterior opening configured to receive a trim plate. The bezel extends around a perimeter of the display surface. A heat sink is in connection with the display module and disposed behind the display module relative to the display surface. A carrier bracket is disposed in connection with the heat sink and disposed inside the housing. A plurality of display mounting brackets is in connection with the carrier bracket. The display mounting brackets are in connection with the carrier bracket through apertures in the trim plate.

These and other features, advantages, and objects of the present device will be further understood and appreciated by those skilled in the art upon studying the following specification, claims, and appended drawings.

BRIEF DESCRIPTION OF THE DRAWINGS

The invention will now be described with reference to the following drawings, in which;

FIG. 1A is a front perspective view of a display apparatus;

FIG. 1B is a rear view of a display apparatus;

DETAILED DESCRIPTION OF EMBODIMENTS

Figure 2:
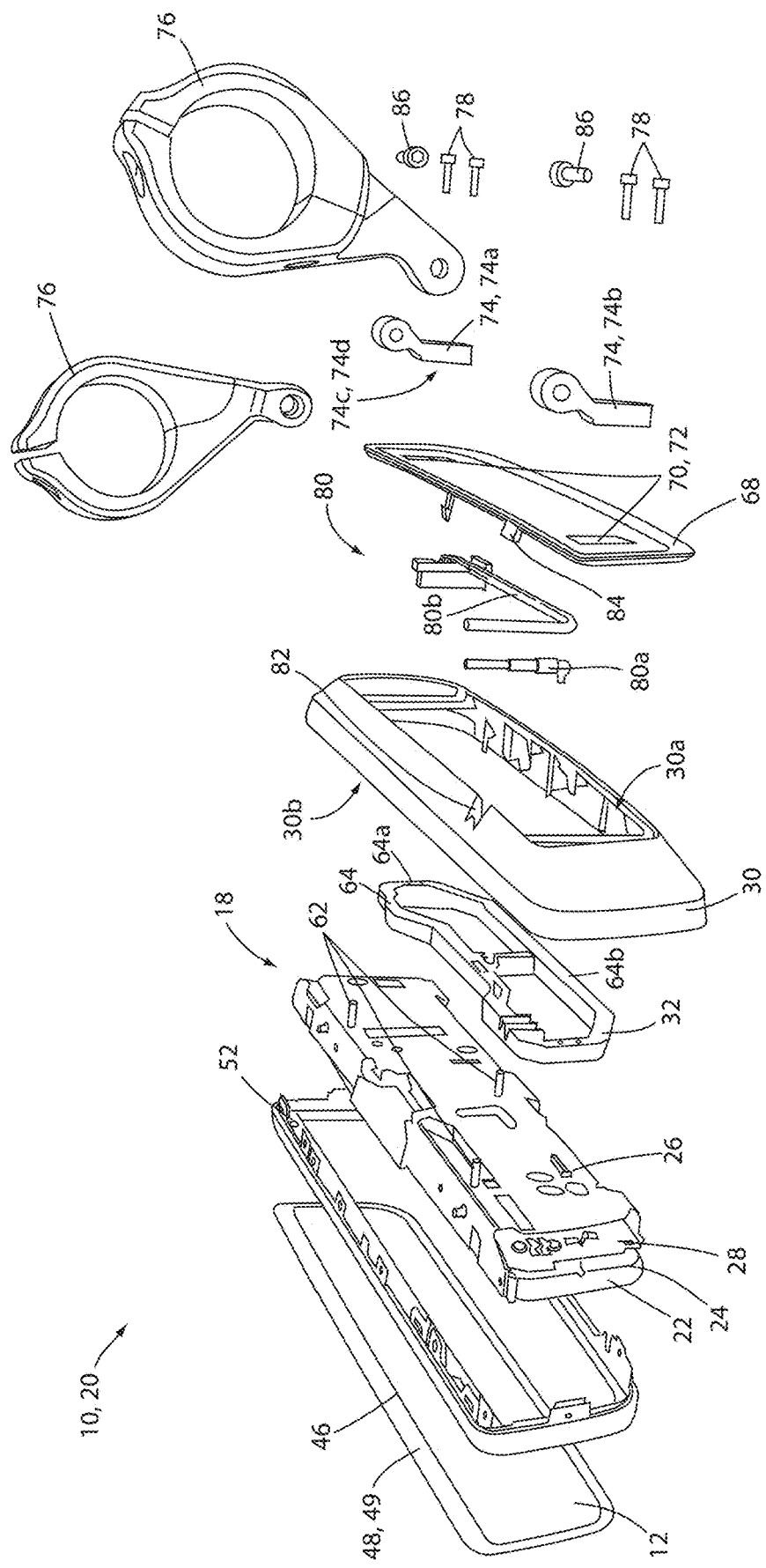
FIG. 2 is an exploded assembly view of the display apparatus.

The presently illustrated embodiments reside primarily in combinations of method steps and apparatus components related to a display mirror. Accordingly, the apparatus components and method steps have been represented, where appropriate, by conventional symbols in the drawings, showing only those specific details that are pertinent to understanding the embodiments of the present invention so as not to obscure the disclosure with details that will be readily apparent to those of ordinary skill in the art having the benefit of the description herein. Further, like numerals in the description and drawings represent like elements.

For purposes of description herein, the terms "upper," "lower," "right," "left," "rear," "front," "vertical," "horizontal," and derivatives thereof shall relate to the invention as oriented in FIG. 1A. Unless stated otherwise, the term "front" shall refer to the surface of the element closer to an intended viewer of the display mirror, and the term "rear" shall refer to the surface of the element further from the intended viewer of the display mirror. However, it is to be understood that the invention may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The terms "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises a . . . " does not, without more constraints, preclude the existence of additional identical elements in the process, method, article, or apparatus that comprises the element.

Referring now to FIGS. 1-4, reference numeral 10 generally designates a display assembly for a vehicle. The display assembly 10 includes a transparent substrate 12 (also referred to as a "glass element" herein) and a display module 18 that is viewed through the partially reflective, partially transparent substrate 12. The display module 18 generally includes several components 20, including a display 22, an optic block 24, a heat sink 26, and a primary printed circuit board (PCB) 28. A housing 30 at least partially receives the display module 18 and is in connection with a mounting member or assembly 32 extending rearwardly therefrom. The mounting assembly 32 is adapted for mounting to a portion of a vehicle.

The display assembly 10 has a viewing area 40, which includes a front surface 42 of the transparent substrate 12. The viewing area 40 may be a rectangular shape, a trapezoidal shape, or any custom contoured shape desired for aesthetic reasons. The transparent substrate 12 is generally planar, with an outer perimeter 46 and a border 48 around the outer perimeter 46. The border 48 may incorporate a chrome ring 49 or other similar finish to conceal one or more elements located behind the transparent substrate 12 in the display assembly 10, including without limitation a seal on an electrochromic unit, an applique, foam adhesive, or pad printing. The border 48 may extend from the outer perimeter 46 of the transparent substrate 12 to an outer edge 50 of the display 22. Alternatively, the border 48 may be narrower and not reach from the outer perimeter 46 to the outer edge 50 of the display 22 along at least some portions of the border 48. The perimeter 46 of the transparent substrate 12 may also have a ground edge, a beveled edge, or be frameless.

In various embodiments, the display 22 may comprise similar features to those discussed in U.S. Pat. No. 10,018, 843 entitled "Display Mirror Assembly" and U.S. Pat. No. 10,189,408 entitled "Display Mirror Assembly Incorporating Heatsink," the disclosure of each of above-mentioned patent documents is incorporated herein by reference in its entirety.

Figure 3:
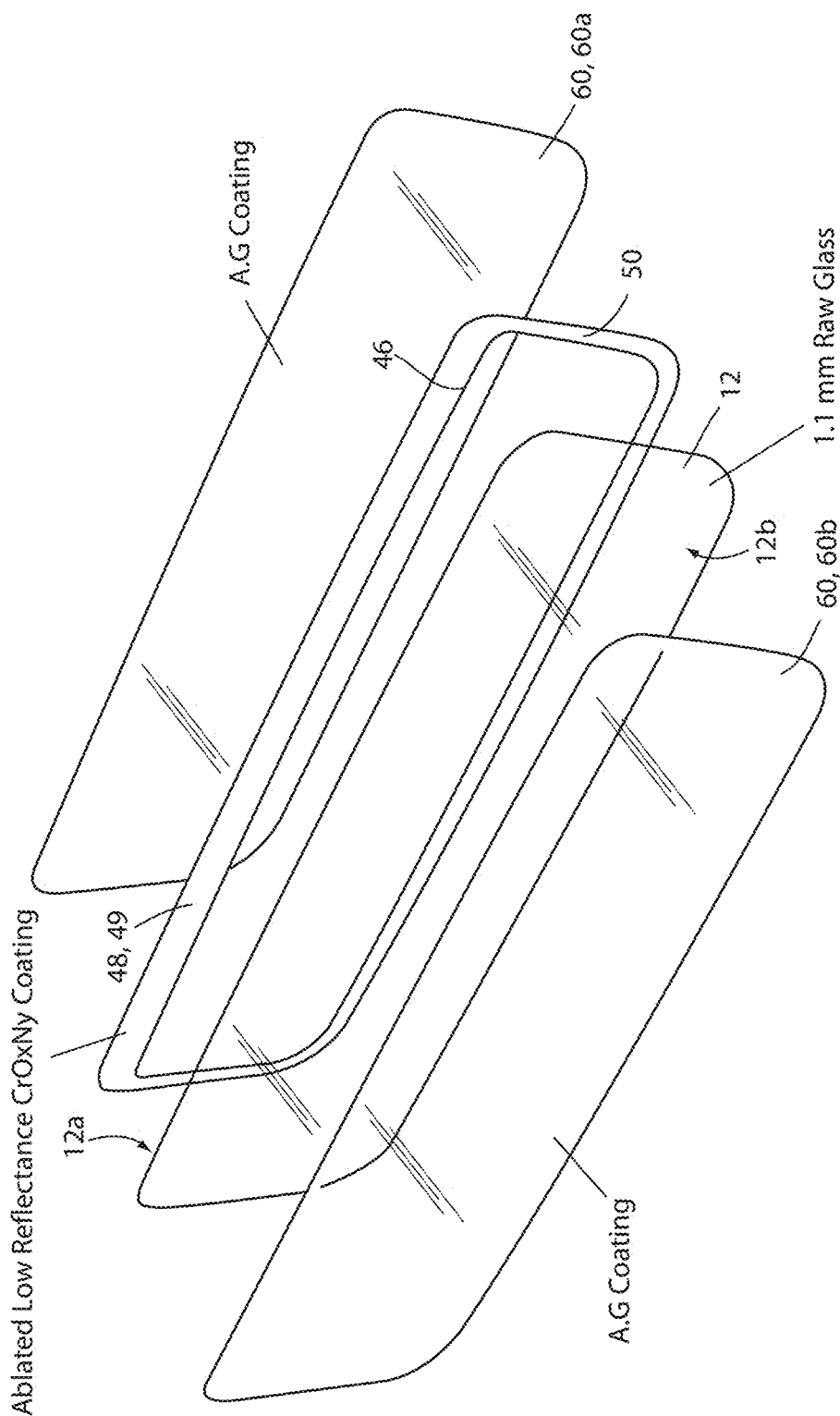
FIG. 3 is an exploded detailed view of a transparent substrate of the display apparatus.
Figure 4:
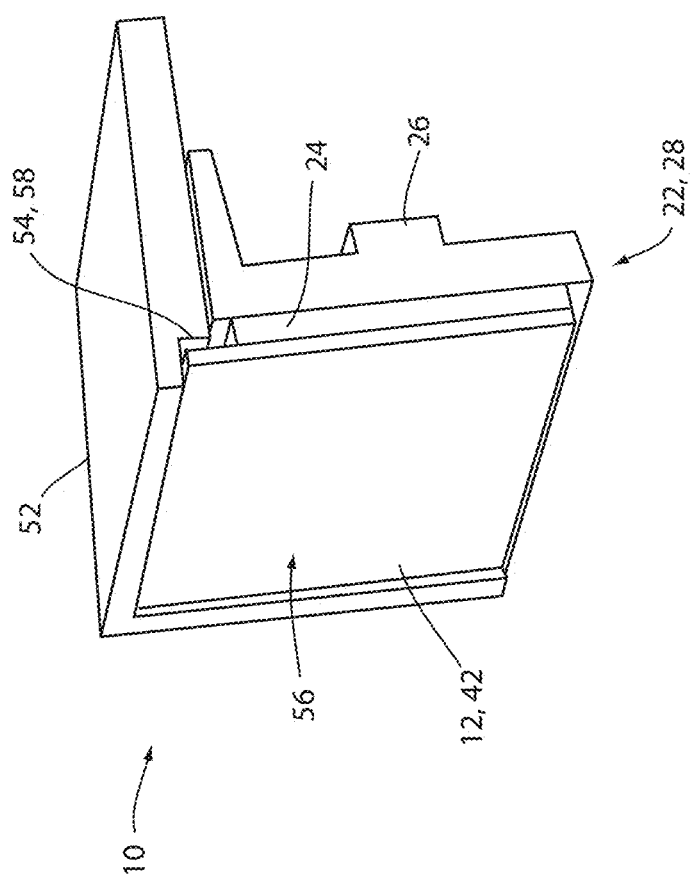
FIG. 4 is a detailed cross-sectional view of a transparent substrate of the display apparatus demonstrating a bezel in accordance with the disclosure.

In an exemplary embodiment, the display assembly 10 may comprise a thin bezel 52. The bezel 52, which may form a shelf 54 recessed into an opening 56 formed by the bezel 52. The shelf 54 may correspond to a support surface 58 configured to position the transparent substrate 12 within the opening in the recessed configuration. The transparent substrate 12 may comprise a single piece of glass comprising an anti-glare coatings 60a and 60b disposed on an inside surface 12a and an outside surface 12b, respectively. FIG. 3 demonstrates an exploded view of the transparent substrate 12 demonstrating the anti-glare coatings 60.

The chrome ring 49 may be disposed along the perimeter 46 of the transparent substrate such that the border 48 forms an opaque, metallic black surface. The chrome ring 49 may correspond to a low reflectance coating of chromium oxynitride (CrOxNy). The transparent substrate 12 is connected to the assembly 10 via a foam backer 62 or adhesive. In this configuration, the transparent substrate is configured to be disposed within the periphery of the bezel 52. Accordingly, the assembly 10 may provide for a light, lightweight package.

The optic block 24, the heat sink 26, and the primary PCB 28 may be disposed in the housing 30. In an exemplary embodiment, the heat sink 26 comprises a plurality of fastening apertures 66 (not shown), configured to connect to an internal carrier bracket 64. The internal carrier bracket 64 may be formed of aluminum and configured to attach to the heat sink 26 via a plurality of fasteners 66. The housing 30 may be configured to enclose the display module 18 in connection with the bezel 52 and a rear trim plate 68. For example, the bezel 52 may enclose an anterior opening 30b of the housing 30 in connection with the transparent substrate 12. In an exemplary embodiment, the housing 30 may be connected to the bezel 52 via a snap-fit assembly secured around the periphery of the bezel 52. Additionally, the trim plate 68 may enclose the posterior opening 30a of the housing 30.

The trim plate 68 may enclose a rear or posterior opening 30a formed in the housing 30 and may comprise a pocket 70 comprising apertures 72 which may interconnect a plurality of display mounting brackets 74 forming the mounting assembly 32 to the internal carrier bracket 64. The posterior opening 30a may extend approximately co-extensive or in excess of a perimeter of the carrier bracket 64. In this configuration, the display mounting brackets 74 may extend through the apertures 72 to connect with the carrier bracket 64. Accordingly, the internal carrier bracket 64 may connect the heat sink 26 and the connected display module 18 to the display mounting brackets 74 such that the display assembly 10 may be suspended from the display mounting brackets 74.

In various instances, the display mounting brackets 74 may form a connection surface 74c and a connection perimeter 74d configured to pass through each of the apertures 72 and connect with the carrier bracket 64. The connection surface 74c may comprise a flat surface configured to engage a complementary surface of the carrier bracket 64. The complementary surfaces of the display mounting brackets 74 and the carrier bracket 64 may form a thermally conductive interface that may be configured transfer heat energy from the display module 18. The heat energy of the display module 18 may be conducted through the heat sink 26 and the carrier bracket 64 and outward through the display mounting brackets 74 via the thermally conductive interface. In this way, an exposed surface of the display mounting brackets 74 may dissipate heat energy from the display module 18 to an environment outside the housing 30 and the trim plate 68. In order to improve the heat transmission, the display mounting brackets 74 may comprise an elongated body extending along the thermally conductive interface and forming an exposed surface extending from the connection perimeter 74d to the environment outside the housing 30 and the trim plate 68.

The display mounting brackets 74 may further be in connection with a plurality of vehicle mounting brackets 76. The vehicle mounting brackets 76 may be configured to connect to a cylindrical connection portion of the vehicle. For example, the vehicle mounting brackets 76 may be configured to connect to a tubular structural support or various portions of the vehicle to form the mounting assembly 32. In this configuration, the bezel 52, the housing 30, and the trim plate 68 may enclose the display module 18, the heat sink 26, and the internal carrier bracket 64. The display assembly 10 may then be mounted in the vehicle with a plurality of display fasteners 78 passing through the apertures 72 in the trim plate 68 and connecting the internal carrier bracket 64 to the display mounting brackets 74. Though the vehicle mounting brackets 76 are discussed as being configured to connect to a cylindrically shaped object, the vehicle mounting brackets 76 may be implemented to connect to various portions of the vehicle, which may vary in shape and proportion.

The display mounting brackets 74 may comprise a first bracket 74a and a second bracket 74b positioned outboard from a center line C bisecting the display assembly 10 from a top portion to a bottom portion. In some embodiments, the first display bracket 74a and the second display bracket 74b may be connected to a vertically extending perimeter portion 64a of internal carrier bracket 64. The vertically extending perimeter portions 64a of the internal carrier play may be interconnected by one or more horizontal perimeter portions 64b of the internal carrier bracket 64. The display mounting brackets 74 may be configured to connect to the exterior of the housing 30 through the apertures 72 formed in the pockets 70 of the trim plate 68. In this configuration, the display assembly 10 may correspond to a modular assembly configured to be mounted to the vehicle in an assembled configuration.

The modular design of the display assembly 10 may further comprise a modular connection interface 80. The connection interface 80 may be configured to communicatively connect a controller or processor incorporated on the primary PCB 28 to one or more systems of the vehicle. The connection interface may comprise a video connector 80*a* and an accessory connector 80*b*. The video connector 80*a* may be in connection with one or more imaging devices configured to capture image data proximate the vehicle. The accessory connector 80*b* may be configured to supply operating power to the display assembly 10 and may additionally provide for communication between the display assembly 10 and one or more vehicle systems (e.g., a vehicle controller, vehicle bus connection, etc.).

The connection interface 80 may be routed from the primary PCB 28 through the housing 30 via one or more cable management guides. The cable management guides may secure conductive connections for the video connector 80*a* and an accessory connector 80*b* within the housing 30 and direct the connections outward through a connector aperture 82 formed in the housing 30 along the rear opening. The trim plate 68 may comprise a complementary tab 84 configured to extend from the rear opening into the connector aperture 82. In an assembled configuration, the connector aperture formed in the housing 30 in combination with the complementary tab 84 may enclose around a perimeter of the conductive connections of the video connector 80*a* and the accessory connector 80*b* such that the housing 30 and the trim plate 68 combine to create at least one aperture enclosing and conforming to a perimeter of the at least one conductive connection.

In some embodiments, the vehicle mounting brackets 76 may be connected to the display mounting brackets 74 by bracket fasteners 86 along an adjustment axis A. The adjustment axis A may extend substantially perpendicular to the center line C bisecting the display assembly 10 from a top portion to a bottom portion. Additionally, the adjustment axis A may extend parallel to the front surface 42 of the display 22. In this configuration, the display assembly 10 may be rotated about the adjustment axis A and the bracket fasteners 86 such that the display front surface 42 may rotate with the display mounting brackets 74 relative to the vehicle mounting brackets 76.

In some embodiments, the vehicle mounting brackets 76 may correspond to bar clamps. In this configuration, the vehicle mounting brackets 76 may be configured to connect to one or more bars, rails, cylindrical structures, and/or rounded portions of the vehicle. The bars may correspond to a cylindrical support rail, which may correspond to a structural support in connection with a roof portion of the vehicle. Though a specific configuration for the vehicle mounting brackets 76 is discussed herein, the display assembly 10 may be connected to the vehicle via numerous connections, adapters, and/or fasteners without departing from the spirit of the disclosure.

It will be understood that any described processes or steps within described processes may be combined with other disclosed processes or steps to form structures within the scope of the present device. The exemplary structures and processes disclosed herein are for illustrative purposes and are not to be construed as limiting.

It is also to be understood that variations and modifications can be made on the aforementioned structures and methods without departing from the concepts of the present device, and further it is to be understood that such concepts are intended to be covered by the following claims unless these claims by their language expressly state otherwise.

The above description is considered that of the illustrated embodiments only. Modifications of the device will occur to those skilled in the art and to those who make or use the device. Therefore, it is understood that the embodiments shown in the drawings and described above are merely for illustrative purposes and not intended to limit the scope of the device, which is defined by the following claims as interpreted according to the principles of patent law, including the Doctrine of Equivalents.

What is claimed is:

1. A display apparatus for a vehicle comprising:
   a display module comprising a display forming a display surface forming a perimeter;
   a heat sink in connection with the display module and disposed behind the display module relative to the display surface;
   a carrier bracket disposed in connection with the heat sink; and
   a plurality of display mounting brackets in connection with the carrier bracket, wherein the display mounting brackets are in connection with the carrier bracket through a trim plate of a housing enclosing the display module and are disposed in a spaced-apart relationship with one another, a first of the display mounting brackets on a first side of a center line extending vertically along the carrier bracket and a second of the display mounting brackets on a second side of the center line;
   wherein the trim plate comprises a plurality of apertures configured to connect the display mounting brackets to the carrier bracket;
   wherein each of the display mounting brackets form a connection surface and a connection perimeter configured to pass through each of the apertures and connect with the carrier bracket;
   wherein the connection surface comprises a flat surface configured to engage a complementary surface of the carrier bracket; and
   wherein the complementary surfaces of the display mounting brackets and the carrier bracket form a thermally conductive interface.

2. The display apparatus according to claim 1, wherein the display module is mounted to a portion of the vehicle via the display mounting brackets in a plurality of locations along a length of a body of a housing.

3. The display apparatus according to claim 1, further comprising:
   a housing enclosing the display module and comprising an anterior opening configured to receive a bezel, wherein the bezel extends around a perimeter of the display surface.

4. The display apparatus according to claim 3, wherein the housing forms a posterior opening extending coextensive to the carrier bracket.

5. The display apparatus according to claim 4, wherein the carrier bracket is disposed inside the housing.

6. The display apparatus according to claim 5, wherein:
   the trim plate is configured to enclose the posterior opening of the housing.

7. The display apparatus according to claim 1, wherein the display mounting brackets are in connection with vehicle mounting brackets via an adjustable connection interface.

8. The display apparatus according to claim 7, wherein the vehicle mounting brackets are configured to connect to a cylindrical connection portion of the vehicle.

9. The display apparatus according to claim 7, wherein the adjustable connection interface is configured to adjust an orientation of the display assembly about an adjustment axis.

10. The display apparatus according to claim 9, wherein the adjustment axis extends substantially perpendicular to the center line that bisects the display assembly.

11. A display apparatus for a vehicle comprising:
a display module comprising a display forming a display surface and a heat sink in connection with the display module and disposed behind the display module relative to the display surface;
a housing enclosing the display module and comprising an opening configured to receive a bezel, wherein the bezel extends around a perimeter of the display surface;
a carrier bracket disposed inside the housing and in connection with the heat sink; and
a plurality of display mounting brackets in connection with the carrier bracket through a trim plate of the housing, wherein the mounting brackets are in connection with the housing and disposed in a spaced-apart relationship with one another on either side of a center line extending vertically along the carrier bracket such that the display module is mounted in a plurality of locations along a length of a body of the housing;
wherein the display mounting brackets are in connection with vehicle mounting brackets via an adjustable connection interface; and
wherein the adjustable connection interface is configured to adjust an orientation of the display assembly about an adjustment axis.

12. The display apparatus according to claim 11, wherein the trim plate comprises a plurality of apertures configured to connect the display mounting brackets to the carrier bracket.

13. The display apparatus according to claim 12, wherein each of the display mounting brackets form a connection surface and a connection perimeter configured to pass through each of the apertures and connect with the carrier bracket.

14. The display apparatus according to claim 13, wherein the connection surface comprises a flat surface configured to engage a complementary surface of the carrier bracket.

15. The display apparatus according to claim 14, wherein the complementary surfaces of the display mounting brackets and the carrier bracket form a thermally conductive interface.

16. The display apparatus according to claim 15, wherein the thermally conductive interface is configured to transfer heat energy from the display module, through the heat sink and the carrier bracket, and outward through the display mounting brackets via the thermally conductive interface.

17. The display apparatus according to claim 15, wherein the display mounting brackets comprise an elongated body extending along the thermally conductive interface, the elongated body forming an exposed surface extending from the connection perimeter.

18. The display apparatus according to claim 17, wherein the exposed surface is exposed to an environment outside the housing and the trim plate.

19. A display apparatus for a vehicle comprising:
a display module comprising a display forming a display surface forming a perimeter;
a housing enclosing the display module and comprising an anterior opening configured to receive a bezel and a posterior opening configured to receive a trim plate, wherein the bezel extends around a perimeter of the display surface;
a heat sink in connection with the display module and disposed behind the display module relative to the display surface;
a carrier bracket disposed in connection with the heat sink disposed inside the housing; and
a plurality of display mounting brackets in connection with the carrier bracket, wherein the display mounting brackets are in connection with the carrier bracket through apertures in the trim plate;
wherein each of the display mounting brackets form a connection surface and a connection perimeter configured to pass through each of the apertures and connect with the carrier bracket;
wherein the connection surface comprises a flat surface configured to engage a complementary surface of the carrier bracket; and
wherein the complementary surfaces of the display mounting brackets and the carrier bracket form a thermally conductive interface.

* * * * *